(12) United States Patent
Atsumo

(10) Patent No.: US 7,928,817 B2
(45) Date of Patent: Apr. 19, 2011

(54) SWITCHABLE HIGH PASS FILTER/LOW PASS FILTER PHASE SHIFTER HAVING A SWITCH CIRCUIT WITH FETS CONNECTED IN PARALLEL

(75) Inventor: Takao Atsumo, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 254 days.

(21) Appl. No.: 12/222,836

(22) Filed: Aug. 18, 2008

(65) Prior Publication Data

US 2009/0051464 A1 Feb. 26, 2009

(30) Foreign Application Priority Data

Aug. 22, 2007 (JP) ................. 2007-215542

(51) Int. Cl.
*H01P 1/18* (2006.01)
*H01P 1/15* (2006.01)
(52) U.S. Cl. ......... 333/164; 333/139; 333/103; 333/262
(58) Field of Classification Search .................. 333/164, 333/139, 156, 103, 104, 262
See application file for complete search history.

(56) References Cited

U.S. PATENT DOCUMENTS

| 6,674,341 | B2 | 1/2004 | Hieda et al. |
| 7,239,218 | B2 | 7/2007 | Nakamura |
| 2005/0093026 | A1 | 5/2005 | Sagae et al. |
| 2006/0001507 | A1 | 1/2006 | Nakamura |

FOREIGN PATENT DOCUMENTS

| JP | 2005-117634 | 4/2005 |
| JP | 2006-19823 | 1/2006 |
| KR | 10-2006-38520 | 5/2006 |

OTHER PUBLICATIONS

Korean Office Action dated Mar. 10, 2012 with partial English-language translation of Japanese translation.

*Primary Examiner* — Benny Lee
(74) *Attorney, Agent, or Firm* — McGinn IP Law Group, PLLC

(57) ABSTRACT

A switch circuit in which the cut-off characteristic is improved over a wide range of frequencies in the microwave band includes a first field-effect transistor functioning as a switch element, a second field-effect transistor and an inductor. A serially connected circuit composed of the inductor and second field-effect transistor is connected in parallel with the first field-effect transistor across the source and drain thereof. The second field-effect transistor is turned on when the first field-effect transistor operates normally and is turned off when the first field-effect transistor is inspected.

5 Claims, 13 Drawing Sheets

REFERENCE CASE

SWITCHABLE HIGH PASS FILTER/LOW PASS FILTER PHASE SHIFTER HAVING A SWITCH CIRCUIT WITH FETS CONNECTED IN PARALLEL

REFERENCE TO RELATED APPLICATION

This application is based upon and claims the benefit of the priority of Japanese patent application No. 2007-215542 filed on Aug. 22, 2007, the disclosure of which is incorporated herein in its entirety by reference thereto.

TECHNICAL FIELD

This invention relates to a switch circuit and phase shifter. More particularly, the invention relates to a microwave-band switch circuit and to a phase shifter that uses this switch circuit.

BACKGROUND

Several types of phase shifters exist. For example, a line-switching-type phase shifter is known in which 50Ω-lines of different lengths are connected by two SPDTs (single-pole, double-throw) switches and the difference in the electrical lengths of the two lines obtained by switching is used as the amount of phase shift. There is also a filter-switching-type phase shifter in which a plurality of inductances or capacitances of a lumped constant and SPDT switches are combined and use is made of a phase difference that is the result of electrically switching between an LC-type low-pass filter (LPF) and high-pass filter (HPF). The switching portion of a phase shifter also is of various types, such as of the series-shunt type that makes joint use of series-connected FETs (field-effect transistors) and shunt-connected FETs, and resonance type (see Patent Document 1) in which inductors are connected in parallel with FETs.

In such phase shifters, a resonance-type switch of the kind shown in FIG. 11A is used widely in the SPDT switch circuit (see Patent Document 1). As shown in FIG. 11A, the resonance switch comprises a parallel-connected field-effect transistor (referred to simply as a "transistor" below) T10, which serves as a switching element, a resistor R10, and an inductor L10. When such a resonance switch is turned off, a parallel resonance circuit is formed by the capacitance of the transistor T11, when the transistor is OFF, and the inductor L10. In a desired frequency band, therefore, the resonance switch attains a high impedance and exhibits an excellent cut-off characteristic. In a case where pass/fail of the switching transistor T10 is inspected, however, the fact that the drain and source of the transistor T10 are connected directly by the inductor means that a direct current flows through the inductor L10, and DC measurement cannot be carried out.

On the other hand, Patent Document 2 discloses a switch circuit in which, in a process for inspecting a semiconductor device that includes a resonance switch circuit, it is made possible to measure the DC characteristic of the switching element in this circuit. As illustrated in FIG. 11B, this switch circuit includes a resistor R10, transistor T10 having first, second and third electrodes P1, P2, and P3, respectively, in which a high-frequency signal is passed or cut off between the first electrode P1 and second electrode P2 based upon the potential of the third electrode P3, and bias voltages at the first electrode P1 and second electrode P2 are approximately the same; and an inductor L10 and capacitor C10 connected in parallel with the transistor T10 at the first electrode P1 and second electrode P2 and connected in series with each other.

In accordance with such a switch circuit, direct current is cut off by the capacitor C10, so that the DC characteristic of the transistor T10 can be measured.

[Patent Document 1] Japanese Patent Kokai Publication No. JP-P2006-19823A

[Patent Document 2] Japanese Patent Kokai Publication No. JP-P2005-117634A

SUMMARY OF THE INVENTION

The entire disclosures of Patent Documents 1 and 2 are incorporated herein by reference thereto.

A filter-switching phase shifter using a resonance-type switch circuit in which FETs and inductors are connected in parallel will now be described. In an exemplary filter-switching phase shifter schematically illustrated in FIG. 10 by "REFERENCE CASE", an S parameter $S_{21}$ representing the pass characteristic is represented by the following equation when a switch on the LPF side is turned on:

$$S_{21} = \frac{2}{2(1 - B_N X_N) + j(B_N + 2X_N - B_N X_N^2)}$$

where $X_N$, $B_N$, respectively represent normalized reactance and susceptance and the following holds:

$$j\frac{\omega L_L}{Z_0} = jX_N$$

$$j\omega C_L Z_0 = jB_N$$

where $\omega$ is angular frequency and $\omega = 2\pi f$ ($\pi$=ratio of circumference of circle to its diameter, f=frequency), $Z_0$ is characteristic impedance, $L_L$ is an inductance of an inductor on a side of a low pass filter, and $C_L$ is a capacitance of a capacitor on a side of the low pass filter.

If the phase of $S_{21}$ is delayed and the phase is represented by $\Phi_1$, then $\Phi_1$ is expressed as follows:

$$\Phi_1 = \tan^{-1}\left[-\frac{B_N + 2X_N - B_N X_N^2}{2(1 - B_N X_N)}\right]$$

On the other hand, when a switch on the HPF side is turned on, $S_{21}$ is obtained as follows by substituting $-X_N$ into $X_N$ and $-B_N$ into $B_N$:

$$S_{21} = \frac{2}{2(1 - B_N X_N) + j(-B_N - 2X_N + B_N X_N^2)}$$

where the following holds:

$$\frac{1}{j\omega C_H Z_0} = -jX_N$$

$$\frac{Z_0}{j\omega L_H} = -jB_N$$

If the phase of $S_{21}$ is delayed and the phase is represented by $\Phi_2$, then $\Phi_2$ is expressed as follows:

$$\Phi_2 = \tan^{-1}\left[-\frac{-B_N - 2X_N + B_N X_N^2}{2(1 - B_N X_N)}\right]$$

A phase-shift quantity $\Delta\Phi$ is represented by the difference between $\Phi_1$ and $\Phi_2$ and is given by the following equation:

$$\Delta\Phi = \Phi_1 - \Phi_2 = -\tan^{-1}\left[-\frac{B_N + 2X_N - B_N X_N^2}{2(1 - B_N X_N)}\right]$$

Further, RMS chase-shift error in a desired band is defined as follows:

$$\text{RMS phase-shift error} = \sqrt{\frac{\sum_{i=1}^{n}(\Delta\Phi - \Phi_0)^2}{n}}$$

where n represents the number of frequency points and $\Phi_0$ represents a stipulated phase-shift quantity.

In the case of the switch circuit of the kind shown in FIG. 11B in which the capacitor C10 (capacitor $C_{ser}$) is in series with the inductor L10 (inductance L), the drain and source of the transistor T10 are short-circuited in equivalent terms at a resonance frequency $f_2$ determined by the following:

$$f_2 = \frac{1}{2\pi\sqrt{LC_{ser}}}$$

by the series resonance circuit formed by the inductor L10 and capacitor C10. When the transistor T10 is turned on, a shorted circuit due to series resonance is formed in parallel with the ON resistance in equivalent terms. When the transistor T10 is turned off, however, a shorted circuit due to series resonance is formed in parallel with the OFF capacitance $C_{off}$. In general, the following holds:

$$C_{off} \neq C_{ser}$$

In this case, if $f_1$ represents the design center frequency, then the following occurs:

$$f_1 \neq f_2$$

and the series resonance frequency and design center frequency appear unrelated. However, both frequency characteristics have a finite Q factor. That is, the frequency characteristic trails a skirt and, at the design center frequency $f_1$, exhibits a low impedance in which the short-circuited state attained is not of the same degree as at frequency $f_2$. Accordingly, at $f_1$ the isolation of the switch is not as good as expected and leakage of power may occur.

This problem is one solely of the switch circuit. Furthermore, in a case where the switch circuit is used to construct a phase shifter, the characteristic may deteriorate, as set forth below.

In a case where the switch circuit illustrated in FIG. 11B is applied to a filter switching phase shifter, the equivalent circuit of the phase shifter is the circuit shown in FIG. 12. A switch circuit on the HPF side is ON and a switch circuit on the LPF side is OFF. Since the input and output are symmetrical, the equivalent circuit as seen from the side of the LPF in FIG. 12 can be simplified as shown in FIG. 13, as the inductor L10 and the capacitor C10 connected in parallel with the OFF capacitance Ct having an inductor L3 connected to ground via a capacitor C3/2, having half the capacitance of capacitor C3. This circuit is in the short-circuited state at the serial resonance frequency of the inductor L10 and capacitor C10. At the series resonance frequency, therefore, the parallel resonance circuit that should be formed by the OFF capacitance Ct and inductor L10. formed in parallel with resistor Rt. is not formed and short-circuiting occurs as shown in FIG. 12.

Assume for example a 90° bit phase shifter in which the band of the phase shifter is 10.7 to 12.7 GHz and the design center frequency is 11.7 GHz. At such time the following holds in the phase shifter of FIG. 12: for the HPF, constants L2=0.96 nH and C2=0.66 pF, and for the LPF, constants L3=0.28 nH and C3=0.19 pF. Further, since the design center frequency is assumed to be 11.7 GHz, the resonance inductor L10 takes on a value of 1.4 nH, and the capacitor C10 is made 0.5 pF.

The frequency characteristic of impedance Z in FIG. 13 in the case of the above-mentioned constants is illustrated by a curve labeled "RELATED ART" in FIG. 3. This curve indicates the impedance Z is almost zero in the vicinity of 5.5 GHz. Calculating resonance frequency f of the series resonance circuit comprising the total inductance of the inductor L10 and the inductor L3 constituting the LPF and the capacitor C10, we have the following:

$$f = \frac{1}{2\pi\sqrt{(L1 + L3)\cdot C10}}$$

$$= \frac{1}{2\pi\sqrt{(1.4nH + 0.28nH)\times 0.5\text{ pF}}}$$

$$= 5.5\text{ GHz}$$

This is a frequency equal to 5.5 GHz at which the impedance becomes zero.

A curve labeled "RELATED ART" in FIG. 4 indicates a pass characteristic when the HPF side is on and the LPF side is off in the 90°-bit phase shifter having the above-mentioned circuit constants. The pass characteristic deteriorates at frequencies 3.3 GHz, 6.6 GHz and 10.4 GHz, which are frequencies other than 5.5 GHz. The cause of this deterioration in pass characteristic is not the simple circuit shown in FIG. 13 but the fact that series resonance is produced by the capacitor C10 and other elements and results in the low impedance. At these other frequencies, the signal leaks from the ON side to the OFF side and pass loss is increased. Furthermore, this increase in pass loss causes an undulation (up and down) in the phase angle and worsens the RMS phase-shift error, which is an indicator of the acceptability of the phase-shift quantity. In a calculation of RMS phase-shift error from 10.7 GHz to 12.7 GHz as one example, RMS phase-shift error took on a large value of 24°.

According to a first aspect of the present invention, there is provided a switch circuit that comprises a first field-effect transistor functioning as a switch element; a second field-effect transistor; and an inductor; wherein a serially connected circuit composed of the inductor and second field-effect transistor is connected in parallel with the first field-effect transistor across a source and drain thereof.

According to a second aspect of the present invention, there is provided a phase shifter comprising: first and second single-pole, double-throw switches; a high-pass filter; and a low-pass filter. Each of the first and second single-pole, double-throw switches has first and second switch circuits, wherein a contact on the single-pole side of one is connected to the high-pass filter and a contact on the single-pole side of the other is connected to the low-pass filter; and the first and second switch circuits are adapted so as to turn on exclusively.

The meritorious effects of the present invention are summarized as follows.

In accordance with the present invention, DC measurement of field-effect transistors is facilitated and, when the switch circuit is turned off, a parallel resonance circuit is formed and the switch circuit can be held at a high impedance.

Other features and advantages of the present invention will be apparent from the following description taken in conjunction with the accompanying drawings, in which like reference characters designate the same or similar parts throughout the figures thereof and which may not be all described in detail therein.

BRIEF DESCRIPTIONS OF THE DRAWINGS

BEST MODES OF THE INVENTION

Figure 1:
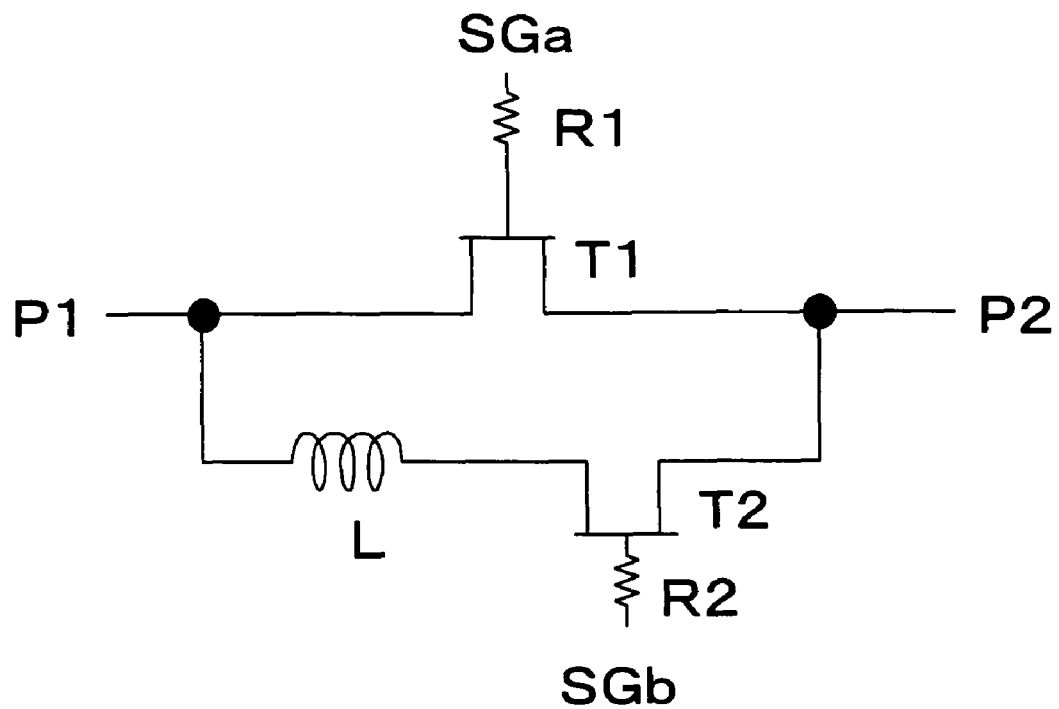
FIG. 1 is a diagram illustrating the configuration of a switch circuit according to a first example of the present invention.

A switch circuit comprises: a first field-effect transistor that functions as a switch element; a second field-effect transistor; and an inductor. A serially connected circuit composed of the inductor and the second field-effect transistor is connected in parallel with the first field-effect transistor across a source and drain thereof. (First Mode) The second field-effect transistor may be turned on at the time of normal operation of the first field-effect transistor and may be turned off when the first field-effect transistor is inspected.

A phase shifter comprises: first and second single-pole, double-throw switches; a high-pass filter; and a low-pass filter. Each of the first and second single-pole, double-throw switches has first and second switch circuits, wherein a contact on the single-pole side of one switch is connected to the high-pass filter and a contact on the single-pole side of the other switch is connected to the low-pass filter; and the first and second switch circuits are adapted so as to turn on exclusively. Each is the switch circuits set forth in the first mode. (Second Mode)

The phase shifter may further comprise first and second inspection pads connected to first and second ends, respectively, of the high-pass filter; wherein it is so arranged that a voltage vs. current characteristic between the first and second inspection pads can be measured.

The phase shifter may further comprise: a third inspection pad connected to gates of the first field-effect transistors in the switch circuits associated with the high-pass filter; a fourth inspection pad connected to gates of the second field-effect transistors in the switch circuits associated with the high-pass filter; a fifth inspection pad connected to gates of the first field-effect transistors in the switch circuits associated with the low-pass filter; and a sixth inspection pad connected to gates of the second field-effect transistors in the switch circuits associated with the low-pass filter.

A switch circuit according to an example of the present invention comprises a first field-effect transistor for functioning as a switch element, a second field-effect transistor and an inductor. A serially connected circuit composed of the inductor and second field-effect transistor is connected in parallel with the first field-effect transistor across a source and drain thereof.

The second field-effect transistor is turned on at the time of normal operation of the first field-effect transistor and is turned off when the first field-effect transistor is inspected.

Further, a phase shifter according to an example of the present invention comprises first and second single-pole, double-throw switches; a high-pass filter; and a low-pass filter; each of the first and second single-pole, double-throw switches having first and second switch circuits, wherein a contact on the single-pole side of one is connected to the high-pass filter and a contact on the single-pole side of the other is connected to the low-pass filter; the first and second switch circuits being adapted so as to turn on exclusively. The first and second switch circuits are each the switch circuit described above.

Further, the phase shifter has first and second inspection pads connected to first and second ends, respectively, of the high-pass filter, and it is so arranged that a voltage vs. current characteristic between the first and second inspection pads can be measured.

Further, the phase shifter has a third inspection pad connected to gates of the first field-effect transistors in the switch circuits associated with the high-pass filter; a fourth inspection pad connected to gates of the second field-effect transistors in the switch circuits associated with the high-pass filter; a fifth inspection pad connected to gates of the first field-effect transistors in the switch circuits associated with the low-pass filter; and a sixth inspection pad connected to gates of the second field-effect transistors in the switch circuits associated with the low-pass filter.

In accordance with the switch circuit described above, pass/fail of the field-effect transistors can be inspected by controlling the gate voltages of the first and second field-effect transistors to turn the transistors on and off, and performing DC measurement.

Further, since the serially connected circuit does not have a capacitor, a series resonance circuit inclusive of an inductor is not formed and a short-circuited state does not arise. That is, a parallel resonance circuit is formed by the OFF capacitance and inductor when the first field-effect transistor is turned off, as a result of which the impedance of the path on the OFF side rises. Consequently, there is no leakage of the signal on the ON side and, as a result, signal loss on the ON side can be reduced.

Examples of the present invention will now be described in detail with reference to the drawings.

FIRST EXAMPLE

FIG. 1 is a diagram illustrating the configuration of a switch circuit according to a first example of the present invention. The switch circuit has transistors T1, T2 and an inductor L. The transistors T1, T2 are constituted by a Schottky-gate-type MESFET (Metal Semiconductor Field-Effect Transistor) or HJFET (Hetero Junction Field-Effect Transistor), etc., of GaAs or the like.

As illustrated in FIG. 1, a first end of the inductor L is connected to the drain of the transistor T1 at a node P1, the source of the transistor T2 is connected to the source of the transistor T1 at a node P2, and the second end of the inductor L is connected to the drain of the transistor T2. Further, control signals SGa, SGb are supplied to the gates of the transistors T1, T2, respectively, via respective resistor elements R1, R2 such that there will be no leakage of high-frequency signals. It goes without saying that an arrangement in which the locations of the transistor T2 and inductor L are interchanged also is within the scope of the present invention.

Normal operation and an operation at the time of inspection in the switch circuit having the configuration set forth above will be described next.

Normal Operation

The transistor T1 is a basic element constituting the switch and takes on an ON state and an OFF state. The transistor T2, on the other hand, is always ON. The transistor T1 is represented as a resistor in equivalent terms when it is in the ON state, and the transistor T2 also is represented as a resistor. In such state, therefore, the switch circuit is represented as a circuit in which a circuit composed of a serially connected resistor element and inductor is connected in parallel with a resistor element. In this case, the switch circuit exhibits the pass characteristic of an ordinary switch.

Further, when in the OFF state, the transistor T1 is represented as an OFF capacitance in equivalent terms. In such state, therefore, the switch circuit is represented as a circuit in which a circuit composed of a serially connected resistor element and inductor is connected in parallel with an OFF capacitance. In this case, the value of the ON resistance is usually a very low value of less than several ohms. When the switch circuit is in the OFF state, therefore, a parallel resonance circuit composed of an OFF capacitance $C_{off}$ and the inductor L is formed. Accordingly, at a frequency represented by $$f_1 = \frac{1}{2\pi\sqrt{LC_{off}}}$$

the impedance of the switch circuit becomes extremely high, i.e., the circuit assumes an open state and the isolation characteristic is excellent.

Operation at Time of Inspection

In general, depletion-type FETs are used as the switch elements. For example, consider a case where use is made of a FET having a threshold-value voltage of −0.5V. In a case where the transistor T1 in the ON state is subjected to a pass/fail inspection, the source of the transistor is grounded, the drain is made, e.g., 3V, and 0V is applied to the gate (control signal SGa). Further, −1V is supplied to the gate (control signal SGb) of the transistor T2 so as to turn off the transistor T2. By applying such voltages, the ON state of transistor T1 can be inspected. In a case where the transistor T1 in the OFF state is subjected to a inspection, it will suffice if the gate voltage of the transistor T1 is made −1V. It should be noted that the gate voltages are controlled in exactly the same manner also in a case where the transistor T2 is subjected to inspection in the ON and OFF states.

The element connected in series with the inductor L that forms the parallel resonance circuit together with the OFF capacitance when the transistor T1 is turned off is not a capacitor but is the ON resistance of the transistor T2. Therefore, since the inductor L does not form a serial resonance circuit, a short-circuited state does not occur. Accordingly, a parallel resonance circuit is formed at a desired frequency, an open state can be obtained and an excellent isolation characteristic can be acquired.

SECOND EXAMPLE

Figure 2:
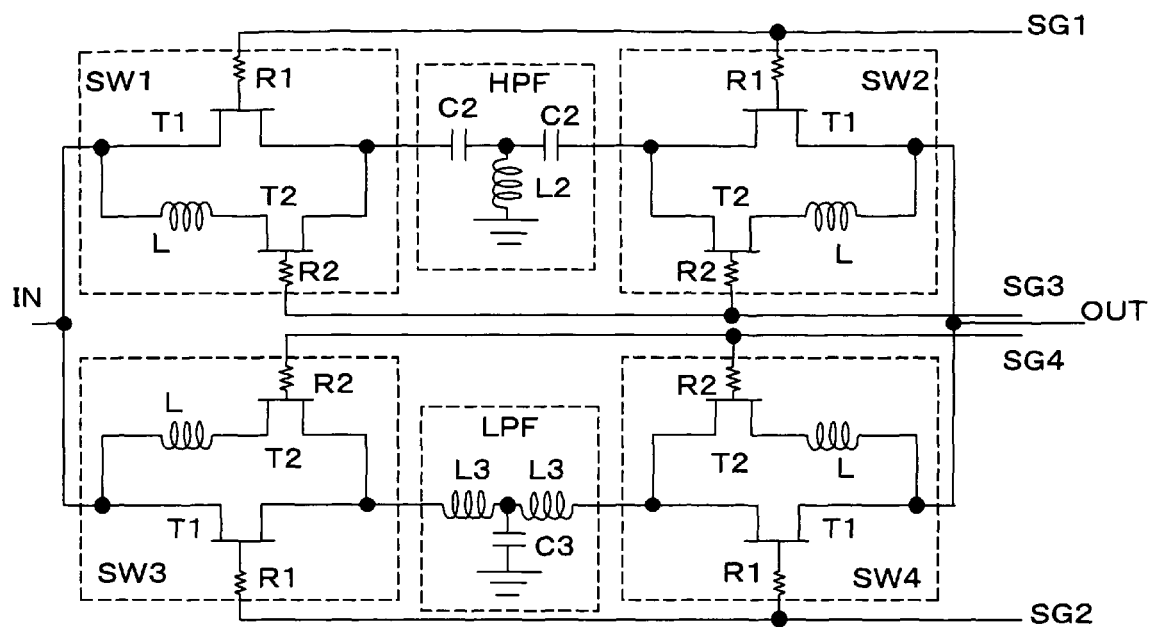
FIG. 2 is a diagram illustrating the configuration of a phase shifter according to a second example of the present invention.

FIG. 2 is a diagram illustrating the configuration of a phase shifter according to a second example of the present invention. The phase shifter in FIG. 2 includes switch circuits SW1, SW2, SW3, SW4, a high-pass filter HPF and a low-pass filter LPF. The switch circuits SW1, SW2, SW3, SW4 are in accordance with the first example. The high-pass filter HPF has two serially connected capacitors C2 and an inductor L2 connected between the node of the two capacitors C2 and ground. The low-pass filter LPF has two serially connected inductors L3 and a capacitor C3 connected between the node of the two inductors L3 and ground.

In the phase shifter of FIG. 2, an input terminal IN is connected to an output terminal OUT via the switch circuit SW1, high-pass filter HPF and switch circuit SW2, and is connected to the output terminal OUT via the switch circuit SW3, low-pass filter LPF and switch circuit SW4.

The transistors T1 in the respective switch circuits operate in contrary (exclusive) fashion in such a manner that if the transistor T1 on the side of the high-pass filter is ON, then the transistor T1 on the side of the low-pass filter is OFF, and vice versa. That is, the control signals SG1 and SG2 take on mutually contrary (opposing each other) signal levels so that the switch circuits SW1, SW3, which construct an SPDT (Single-Pole Double Throw) switch, operate in synch with the switch circuits SW2, SW4, which also construct an SPDT switch.

On the other hand, the signal levels of the control signals SG3, SG4 are set in such a manner that all of the transistors T2 will always be in the ON state.

Figure 3:
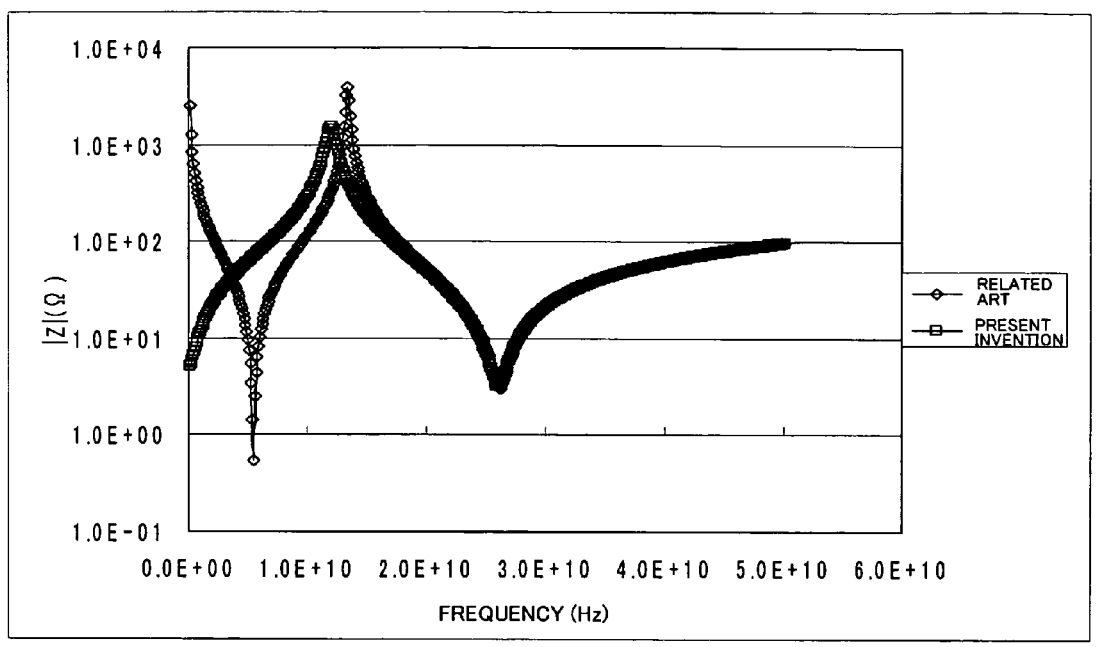
FIG. 3 is a diagram illustrating the impedance characteristic of the phase shifter according to the second example.

In the phase shifter described above, the impedance Z that the input terminal IN sees from the side of the low-pass filter in the OFF state is as illustrated by a curve labeled "PRESENT INVENTION" in FIG. 3. The impedance is high in the band from 10.7 GHz to 12.7 GHz.

Figure 4:
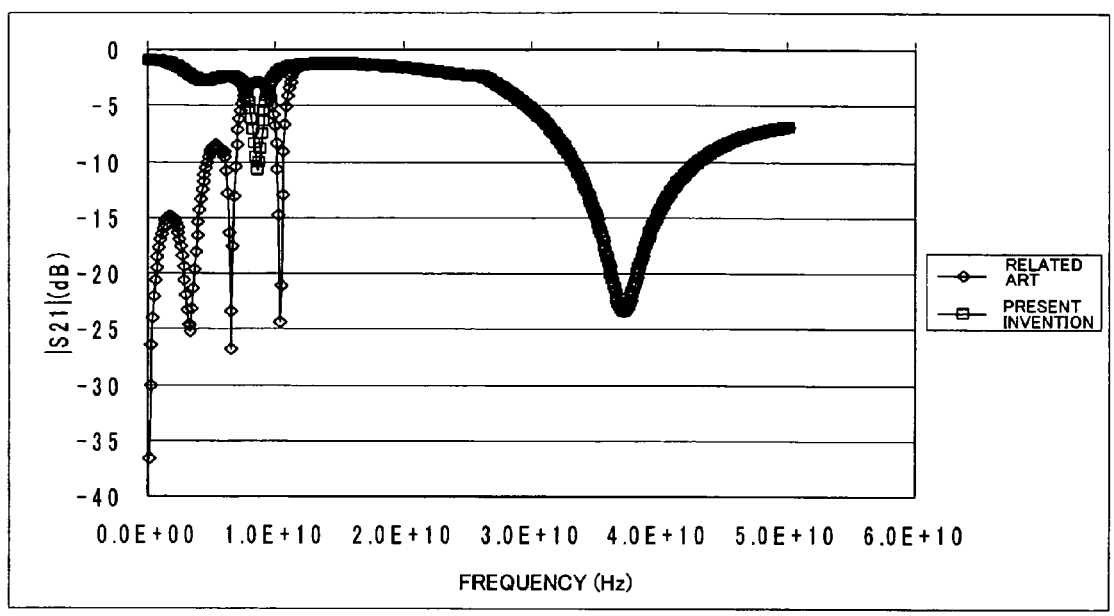
FIG. 4 is a first diagram illustrating the pass characteristic of the phase shifter according to the second example.
Figure 5:
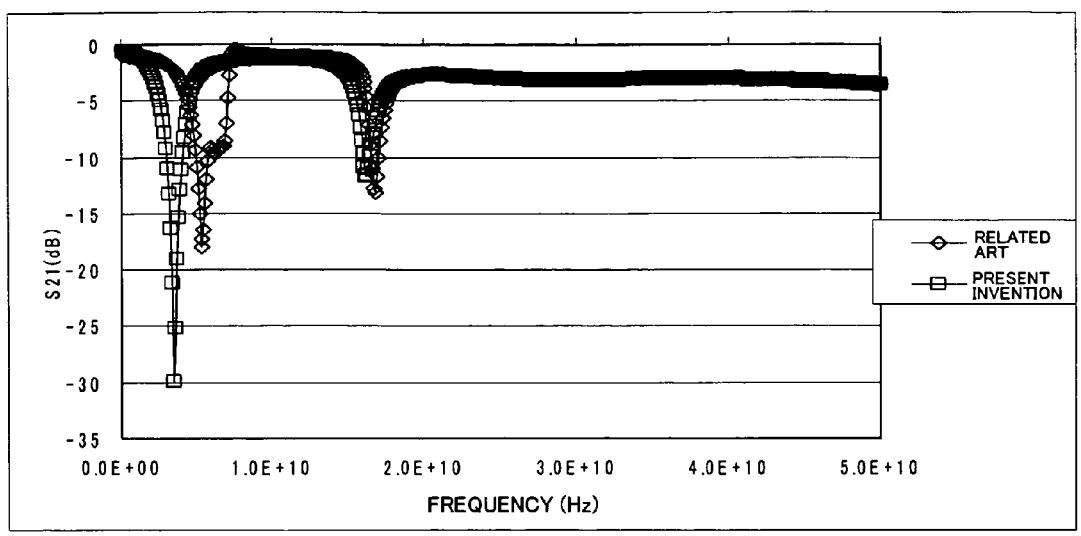
FIG. 5 is a second diagram illustrating the pass characteristic of the phase shifter according to the second example.

Further, FIG. 4 illustrates the frequency (in Hz) characteristic of the S parameter $|S_{21}|$ in dB when a switch circuit on the side of the HPF is ON. FIG. 5 illustrates the frequency (in Hz) characteristic of $|S_{21}|$ in dB when a switch circuit on the side of the LPF is ON. With reference to FIGS. 4 and 5, in the band from 10.7 GHz to 12.7 GHz, the pass characteristic of the phase shifter according to this example is (i.e., PRESENT INVENTION) substantially flat, there is little loss and no problems arise. The reason for this is that the impedance on the side of the OFF filter is sufficiently high.

Figure 6:
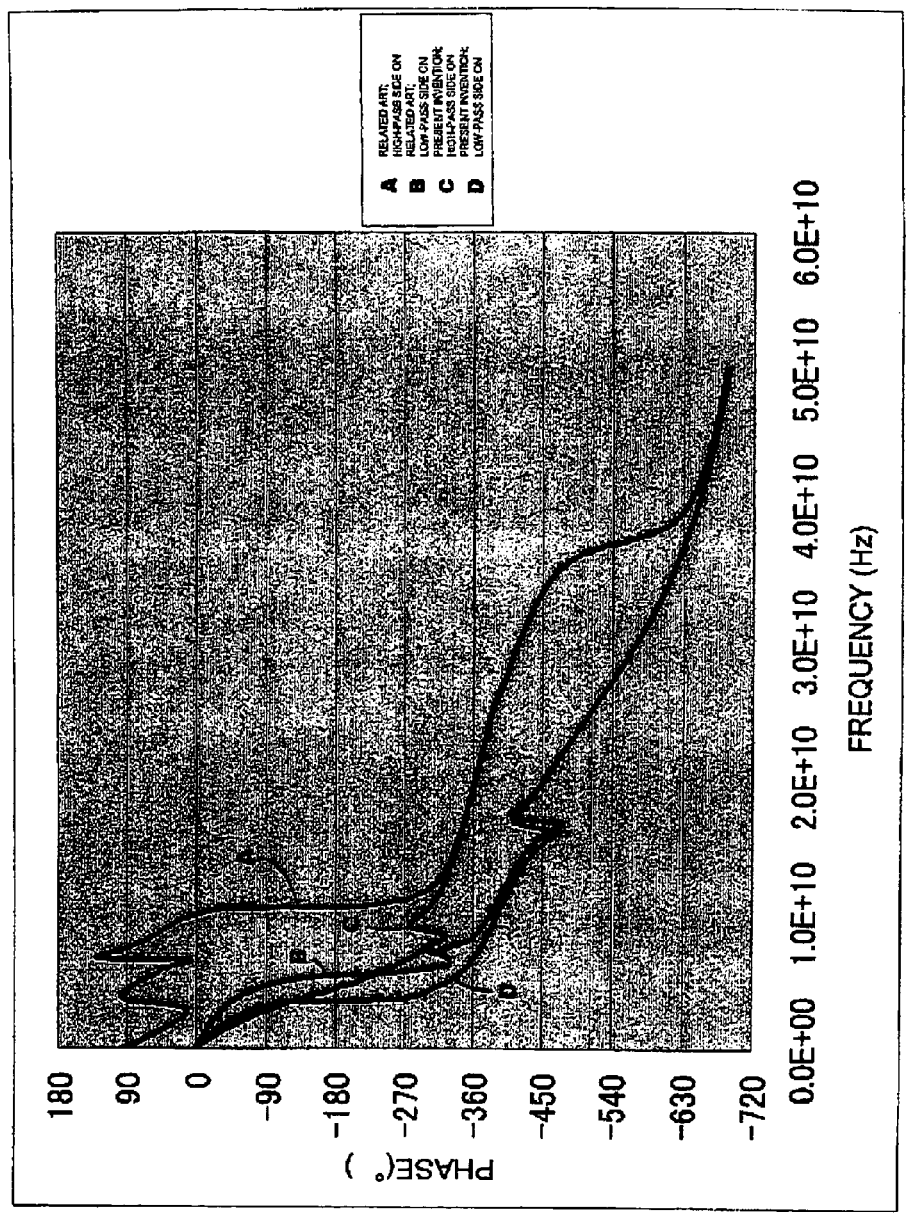
FIG. 6 is a first diagram illustrating the phase-shift characteristic of the phase shifter according to the second example.
Figure 7:
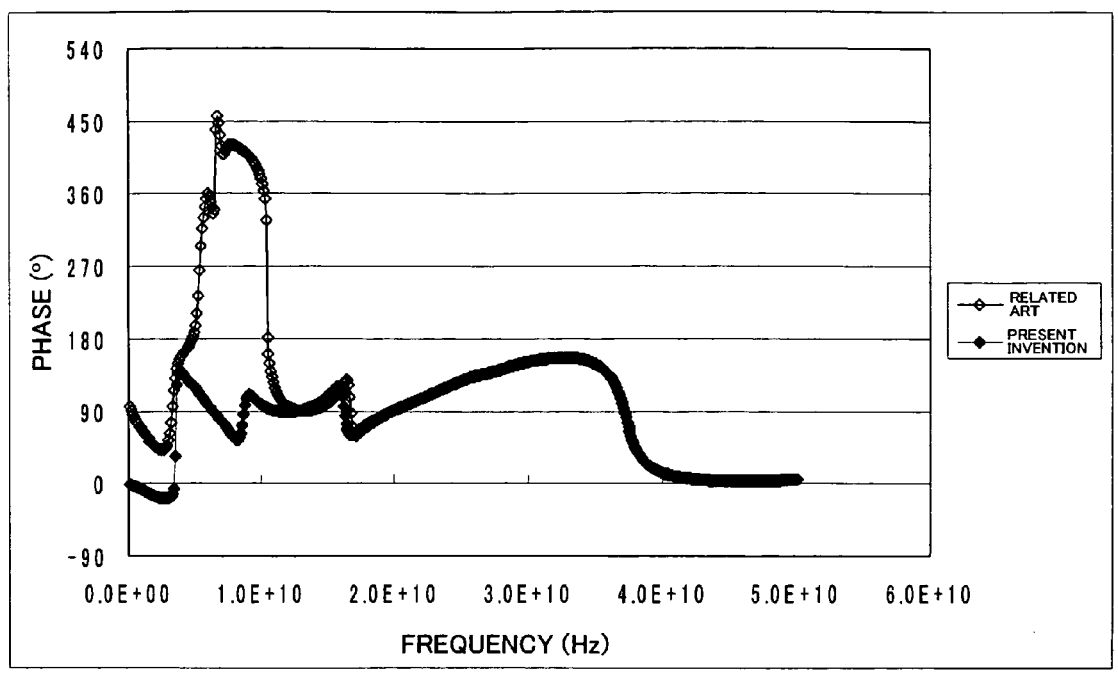
FIG. 7 is a first diagram illustrating the phase-shift quantity of the phase shifter according to the second example.

FIG. 6 illustrates the frequency (in Hz) characteristic of the phase angle)(in°) of S parameter $S_{21}$ and specifically: related art: high-pass side on as illustrated by curve A, related art: low-pass side on as illustrated by curve B, present invention; high-pass side on as illustrated by curve C, and present invention: low-pass side on as illustrated by curve D, and FIG. 7 illustrates the frequency characteristic of the phase-shift quantity (difference in phase angle in°). When RMS phase-shift error is calculated referring to FIG. 7, it is shown that the value in a frequency band of e.g., 10.7 GHz to 12.7 GHz is 24° in the related art (comparative case), as compared to the related art structure having the performance shown in the "Related Art" curve, whereas the value according to the present invention is improved greatly to 0.9°.

In the switch circuits SW1, SW2, SW3, SW4, a capacitor is not connected in series with the inductor that forms the parallel resonance circuit with the OFF capacitance when the transistor T1 is turned off. Rather, the ON resistance of the FET is connected, respectively. Consequently, a series resonance circuit is not formed on the inductor side and a short-circuited state does not occur. Accordingly, a parallel resonance circuit is always formed at any frequency whatsoever and therefore a high impedance can be assured. Thus, since the OFF side is at a high impedance, the signal that is supposed to flow through the ON side does not leak to the OFF side and there is no worsening of pass loss.

THIRD EXAMPLE

Figure 8:
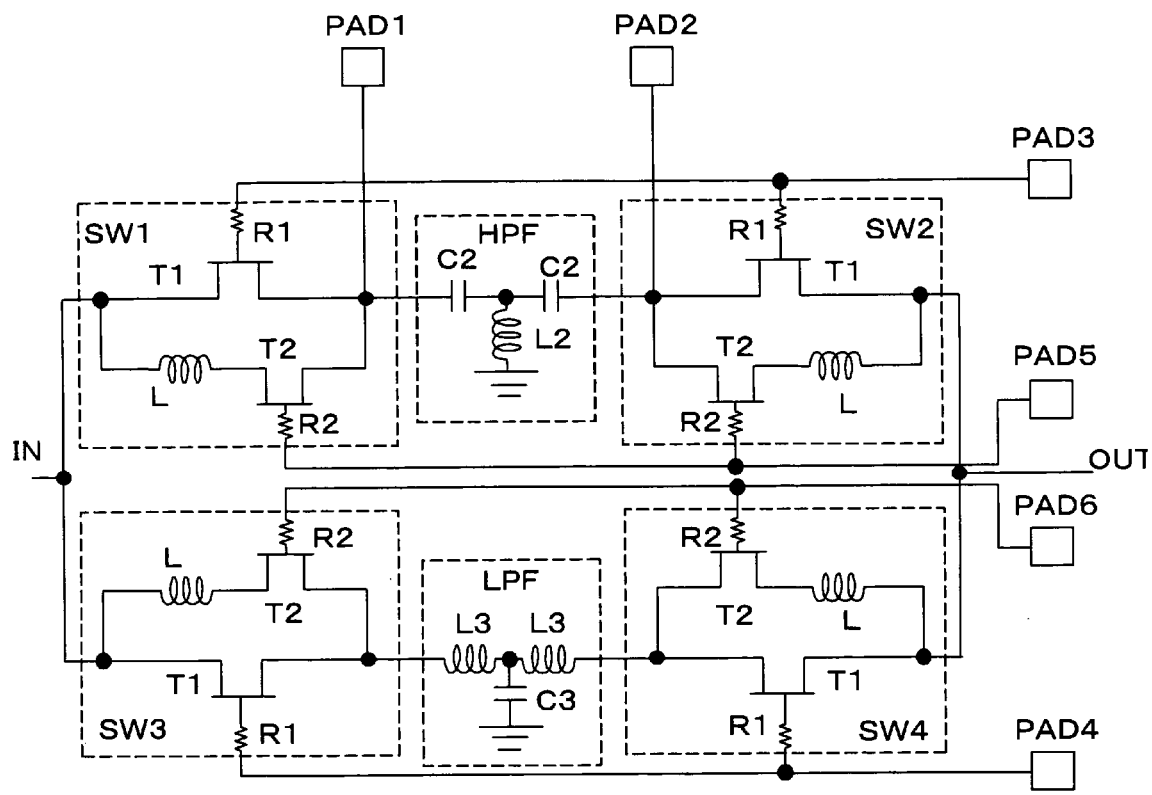
FIG. 8 is a diagram illustrating the configuration of a phase shifter according to a third example of the present invention.

FIG. 8 is a diagram illustrating the configuration of a phase shifter according to a third example of the present invention. Components in FIG. 8 identical with those shown in FIG. 2 are designated by like reference characters, which may not be all described in detail herein. The phase shifter of FIG. 8 is obtained by additionally providing the phase shifter of FIG. 2 with pads PAD1 to PAD6. The pad PAD1 is connected to the switch circuit SW1 and to first end of the high-pass filter HPF. The pad PAD2 is connected to the switch circuit SW2 and to second end of the high-pass filter HPF. The pad PAD3 is connected to the gates of the transistors T1 in the respective switch circuits SW1, SW2 via the resistor elements R1. The pad PAD4 is connected to the gates of the transistors T1 in the respective switch circuits SW3, SW4 via the resistor elements R1. The pad PAD5 is connected to the gates of the transistors T2 in the respective switch circuits SW1, SW2 via the resistor elements R2. The pad PAD6 is connected to the gates of the transistors T2 in the respective switch circuits SW3, SW4 via the resistor elements R2.

At the time of inspection in FIG. 8, one of the pads PAD1, PAD2 is grounded and the other is supplied with an appropriate voltage. Further, in a case where pass/fail of the transistors T1 in the ON state is inspected, a voltage of, e.g., 3V, that will turn on these transistors is supplied to the gates of these transistors and 0V, for example, is supplied to the gates of the transistors T2 so as to turn off the transistors T2. The transistors T1, T2 usually use depletion-type HJFETs of GaAs and the threshold-voltage value is, e.g., about –0.5V. Since 3V is supplied to the gates of transistors T1, the drain and source potential of the transistors T1, T2 is about 2.4V (which is about 0.6V lower) which is the ON voltage (usually indicated as "VF") of a Schottky diode. Accordingly, if the gate voltage of the transistor T2 is 0V, then the source potential is 2.4V higher than the gate potential. In other words, the gate-to-source voltage VGS is –2.4V. Since this is lower than the threshold-value voltage –0.5V, the transistor T2 is OFF. In a case where pass/fail of the OFF transistors is inspected, it will suffice to leave the transistors T2 OFF, turn off the transistors T1 and measure the current. It should be noted that although the foregoing deals with a case where the transistors T1 are inspected, it will suffice if the gate bias voltages are supplied in a similar manner also in a case where the transistors T2 are inspected.

Figure 9:
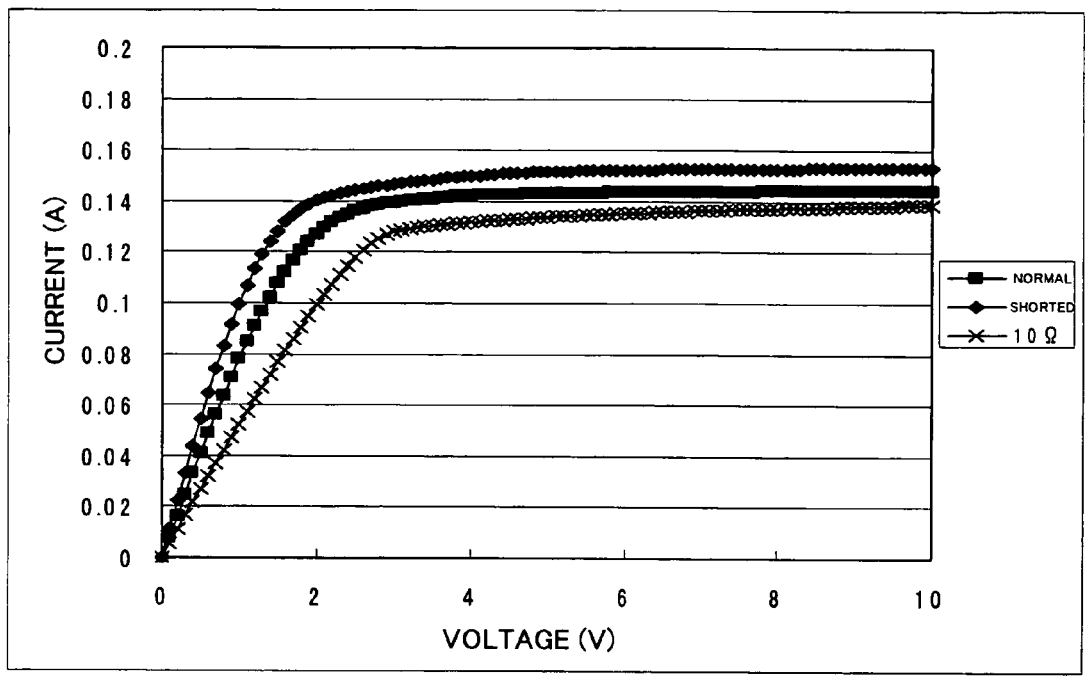
FIG. 9 is a diagram illustrating a voltage vs. current characteristic at the time of inspection of the phase shifter according to the third example.

FIG. 9 is a diagram illustrating the current (in A) vs. voltage (in V) characteristic between the pads PAD1 and PAD2 in the circuit of FIG. 8 in a case where the pad PAD2 is placed at 0V, the voltage at the pad PAD1 is swept from 0V to 10V and 0V is applied to the pads PAD3, PAD4, PAD5 and PAD6. In FIG. 9, "NORMAL" refers to a case where the four transistors T1 are all normal. Further, "SHORTED" refers to a case where one transistor T1 among the four has a short-circuit defect. This indicates that more current flows in the shorted state than in the "NORMAL" case. Further, "10Ω" assumes a case where the ON performed and a selection made between an item that has passed and an item that has failed based upon the fact that current when operation is normal differs from current when operation is abnormal.

Figure 10:
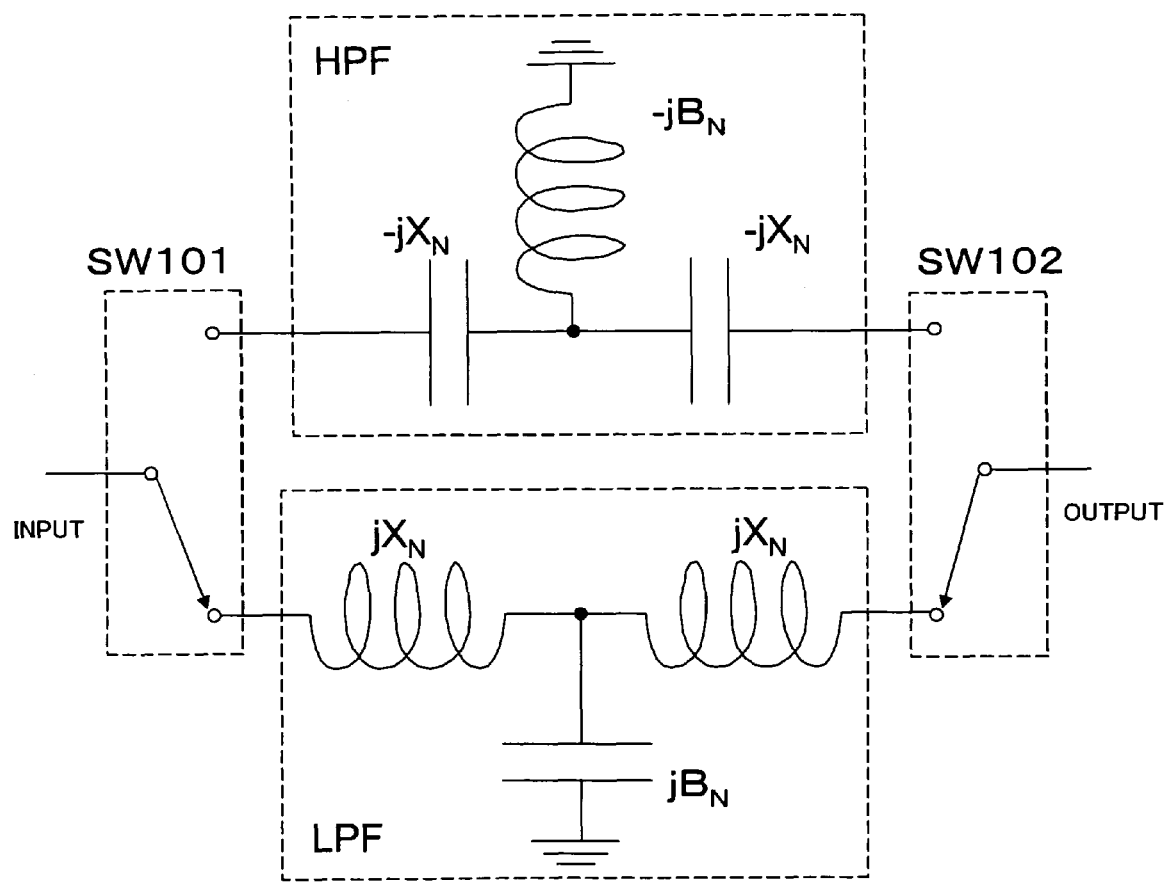
FIG. 10 is a diagram illustrating the configuration of a filter-switching phase shifter.
Figure 11A:
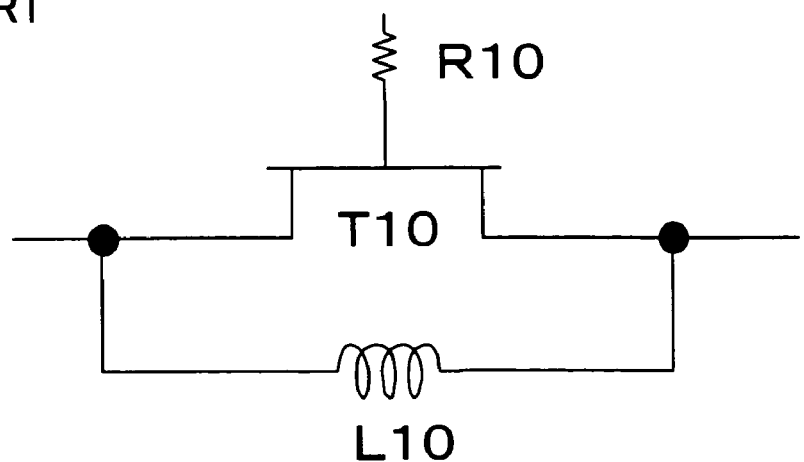
FIGS. 11A and 11B are diagrams illustrating the configurations of switch circuits according to a prior art.
Figure 11B:
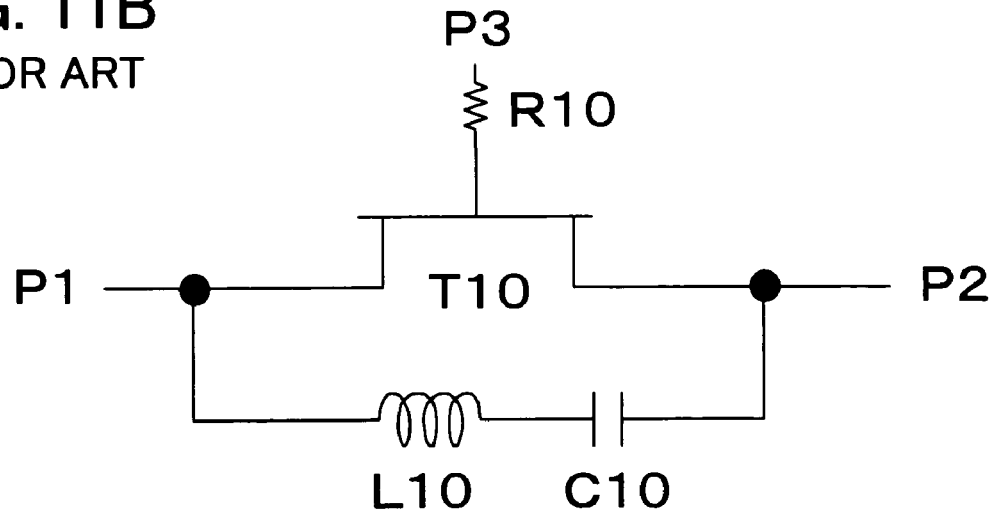
Figure 12:
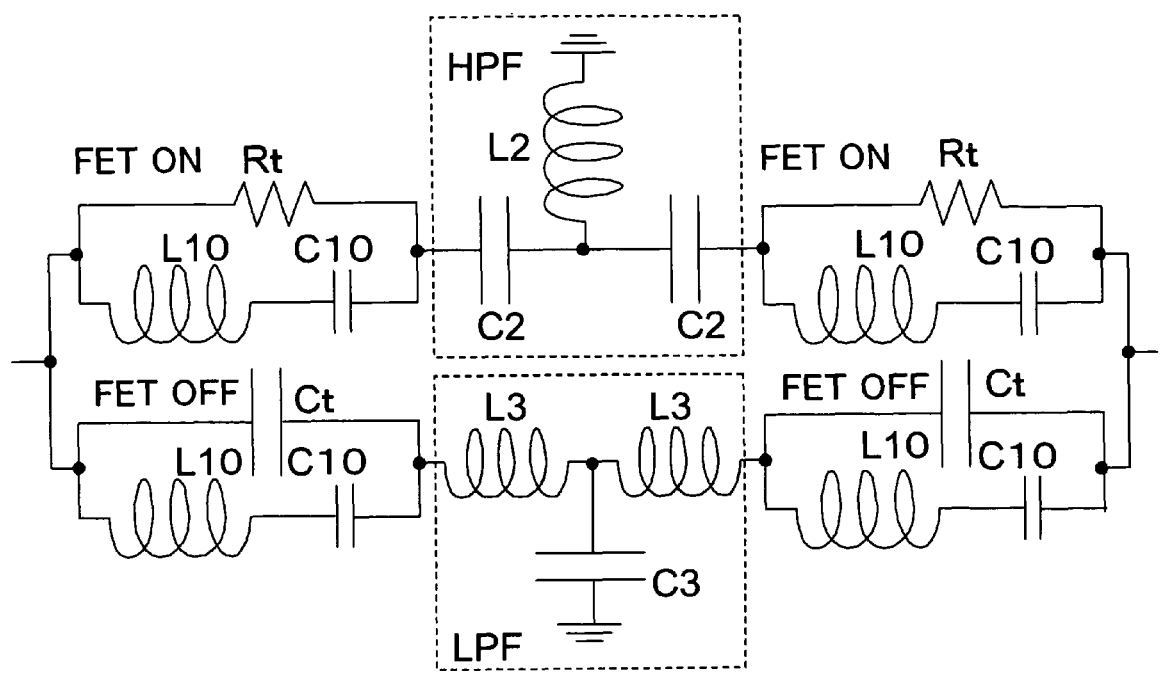
FIG. 12 is a diagram illustrating an equivalent circuit, as a comparative case, of a phase shifter according to a prior art.
Figure 13:
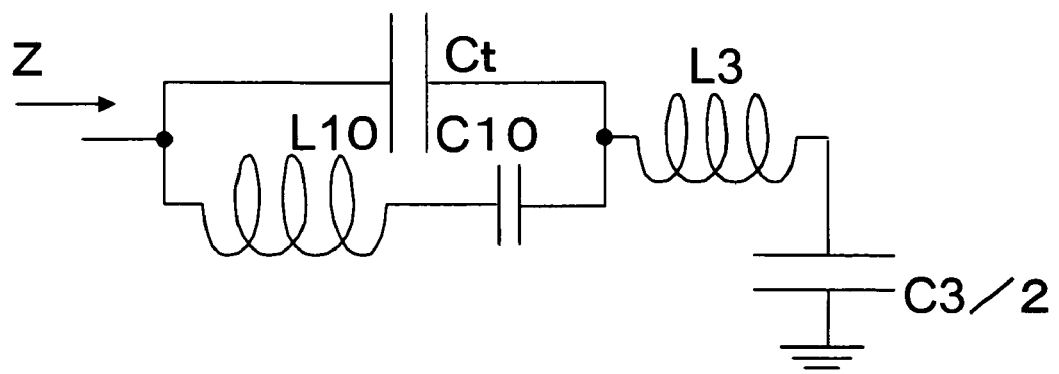
FIG. 13 is an equivalent circuit as seen from the side of the LPF in FIG. 12.

FIG. 10 is a diagram illustrating the configuration of a filter-switching phase shifter. As shown in FIG. 10, there is an INPUT and an OUTPUT, as well as switches SW101 and SW102.

Though the present invention has been described in accordance with the foregoing examples, the invention is not limited to these examples and it goes without saying that the invention covers various modifications and changes that would be obvious to those skilled in the art within the scope of the claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A switch circuit, comprising:
    a first field-effect transistor that functions as a switch element;
    a second field-effect transistor; and
    an inductor,
    wherein a serially connected circuit including said inductor and said second field-effect transistor is connected in parallel with said first field-effect transistor across a source and drain thereof.

2. The switch circuit according to claim 1, wherein said second field-effect transistor is turned on at a time of normal operation of said first field-effect transistor and is turned off when said first field-effect transistor is inspected.

3. A phase shifter, comprising:
    first and second single-pole, double-throw switches;
    a high-pass filter; and
    a low-pass filter,
    wherein each of said first and second single-pole, double-throw switches having first and second switch circuits,
    wherein a contact on the single-pole side of one of the first and second switch circuit is connected to said high-pass filter and a contact on the single-pole side of the other of the first and second switch circuit is connected to said low-pass filter, and
    wherein said first and second switch circuits are adapted so as to turn on exclusively, wherein each of said switch circuits comprises:

a first field-effect transistor that functions as a switch element;

a second field-effect transistor; and an inductor, wherein a serially connected circuit composed of said inductor and said second field-effect transistor is connected in parallel with said first field-effect transistor across a source and drain thereof.

4. The phase shifter according to claim 3, further comprising first and second inspection pads connected to first and second ends, respectively, of said high-pass filter, a voltage vs. current characteristic being measurable between said first and second inspection pads.

5. The phase shifter according to claim 4, further comprising:

a third inspection pad connected to gates of said first field-effect transistors in the first and second switch circuits associated with said high-pass filter;

a fourth inspection pad connected to gates of said second field-effect transistors in the first and second switch circuits associated with said high-pass filter;

a fifth inspection pad connected to gates of said first field-effect transistors in the first and second switch circuits associated with said low-pass filter; and a sixth inspection pad connected to gates of said second field-effect transistors in the first and second switch circuits associated with said low-pass filter.

* * * * *